(12) United States Patent
Stengel et al.

(10) Patent No.: US 7,050,763 B2
(45) Date of Patent: May 23, 2006

(54) METHOD AND DEVICE FOR TRANSFERRING A SIGNAL FROM A SIGNAL SOURCE TO A SIGNAL SINK IN A SYSTEM

(75) Inventors: Jens-Peer Stengel, Grafrath (DE); Jenoe Tihanyi, Kirchheim (DE); Wolfgang Werner, München (DE); Karim-Thomas Taghizadeh-Kaschani, Unterhaching (DE)

(73) Assignee: Infineon Technologies AG, Munich (DE)

( * ) Notice: Subject to any disclaimer, the term of this patent is extended or adjusted under 35 U.S.C. 154(b) by 275 days.

(21) Appl. No.: 10/060,530

(22) Filed: Jan. 30, 2002

(65) Prior Publication Data
US 2002/0106996 A1    Aug. 8, 2002

(30) Foreign Application Priority Data
Jan. 30, 2001    (DE) ................................. 101 03 921

(51) Int. Cl.
*H04B 3/00*    (2006.01)

(52) U.S. Cl. ..................... 455/90.3; 455/270; 455/282; 375/257; 375/219; 333/24 R

(58) Field of Classification Search ................ 455/522, 455/501, 20, 550.1, 90.3, 575.1, 575.8, 61–63, 455/67.1–67.3, 101–103, 115, 226.1–226.3, 455/126, 447–452, 13.4, 296, 115.1, 264, 455/269–275, 276.1, 282; 375/257–258, 375/219–222, 377, 288; 333/24 R, 32, 17.3, 333/109–112
See application file for complete search history.

(56) References Cited

U.S. PATENT DOCUMENTS

| | | | | |
|---|---|---|---|---|
| 4,280,221 A | * | 7/1981 | Chun et al. .................. | 375/288 |
| 5,359,626 A | * | 10/1994 | Kloker et al. ............... | 375/220 |
| 5,410,300 A | * | 4/1995 | Gould et al. ................. | 340/2.2 |
| 5,541,921 A | * | 7/1996 | Swenson et al. ............ | 370/376 |
| 5,621,913 A | * | 4/1997 | Tuttle et al. ................ | 455/41.2 |
| 5,715,274 A | | 2/1998 | Rostoker et al. | |
| 5,751,242 A | * | 5/1998 | Goutzoulis et al. ......... | 342/158 |
| 5,754,948 A | * | 5/1998 | Metze ........................ | 455/41.2 |
| 5,799,248 A | * | 8/1998 | Vice ........................... | 455/333 |
| 5,940,439 A | * | 8/1999 | Kleider et al. .............. | 375/225 |

(Continued)

FOREIGN PATENT DOCUMENTS

DE    29719894 U1 *    1/1998

(Continued)

OTHER PUBLICATIONS

Kihong Kim et al.: "On-Chip Wireless Interconnection with Integrated Antennas", *International Electron Devices Meeting, Dec. 10-13, 2000, IEDM Technical Digest*, pp. 485-488.

(Continued)

*Primary Examiner*—Pablo N. Tran
(74) *Attorney, Agent, or Firm*—Laurence A. Greenberg; Werner H. Stemer; Ralph E. Locher

(57) ABSTRACT

The system has at least two electronic units between which signals are transferred from a first electronic unit and a second electronic unit. The first electronic unit has a signal source. The second electronic unit has a signal sink. A signal to be transferred is converted into a line-independent electromagnetic wave with a transmitting unit and transmitted to a receiving unit. The line-independent electromagnetic wave is received with the receiving unit and converted into a reception signal.

9 Claims, 4 Drawing Sheets

U.S. PATENT DOCUMENTS

| | | | | |
|---|---|---|---|---|
| 6,108,328 | A * | 8/2000 | Ranta et al. | 370/345 |
| 6,542,720 | B1 * | 4/2003 | Tandy | 455/90.3 |
| 6,556,053 | B1 * | 4/2003 | Stanley | 327/108 |
| 6,580,705 | B1 * | 6/2003 | Riazi et al. | 370/347 |
| 6,614,848 | B1 * | 9/2003 | Lohr | 375/257 |
| 6,625,226 | B1 * | 9/2003 | Gersho et al. | 375/285 |
| 6,751,187 | B1 * | 6/2004 | Walton et al. | 370/210 |
| 2002/0125920 | A1 * | 9/2002 | Stanley | 327/108 |
| 2002/0193075 | A1 * | 12/2002 | Lohr | 455/61 |
| 2003/0231046 | A1 * | 12/2003 | Giacomini et al. | 327/333 |

FOREIGN PATENT DOCUMENTS

| | | |
|---|---|---|
| DE | 199 29 841 A1 | 2/2001 |
| EP | 185936 B1 * | 1/1993 |

OTHER PUBLICATIONS

John G. Proakis: "Digital Communications", *McGraw Hill, 3rd ed., 1995*, pp. 842-844 and 852-862.

* cited by examiner

METHOD AND DEVICE FOR TRANSFERRING A SIGNAL FROM A SIGNAL SOURCE TO A SIGNAL SINK IN A SYSTEM

BACKGROUND OF THE INVENTION

Field of the Invention

The present invention relates to a method for transferring a signal from a first electronic unit, which contains a signal source, to a second electronic unit, which contains a signal sink, in a system which comprises at least two electronic units.

The signal to be transferred is an analog signal or a digital signal.

A variety of techniques and devices are known in the art for transmitting signals from a first electronic unit to a second electronic unit in a system. In systems wherein no electrical isolation is required between the two electronic units between which a signal exchange will take place, there is typically a line connection between the first electronic unit and the second electronic unit. In complex systems such as a motherboard of a computer, wherein a signal exchange must take place between complex integrated modules, there is usually a data bus present which connects the individual modules such as the memories, processors, and controllers to one another. The signal transfer requires that additional modules be interposed between the signal sources or sinks and the bus. From the signals that are to be transferred, these modules generate signals with levels that are high enough for transfer over the bus.

In order to connect the mutually communicating individual modules of a complex system to one another by means of a bus system, these modules are usually installed on multi-layer motherboards, with electrically conductive connections inserted between individual layers in order to realize the bus system. Such multi-layered motherboards are expensive and require a large outlay for production. In addition, signal distortions and reflections occur at the bus lines when signals are transferred over a bus system. A space-saving configuration of the individual mutually communicating modules on the motherboard is repeatedly limited by the need for line connections between the individual modules.

A prior art technique for transferring signals between two electronic units which are electrically isolated is to utilize opto-couplers, fiber-optic waveguides, a pulse transformer, a current coupler, or a capacitive coupler.

In an optical coupler, the transmitter and receiver are integrated in a module; the electrical separation between the transmitter and receiver is accomplished by electrically insulating and optically conductive insulation materials. Line connections are usually utilized for the signal transfer from the electronic units to the opto-coupler and from the opto-coupler to the electronic units. The disadvantages of utilizing an opto-coupler are its limited transmission capacity, the limited voltage stability, and the presence of coupling capacities between its input and output. Furthermore, the LED that is utilized as a transmitter in an opto-coupler undergoes an aging process which impairs its normal functioning over time.

When a fiber-optic waveguide is utilized to transfer data, a transmitting unit and a receiving unit are disposed at a distance from one another and connected to each other by the optically conductive waveguide, for instance an optical fiber. It is relatively expensive to use fiber-optic waveguides for data transmission. Furthermore, in this case also, a diode that is utilized on the transmission side undergoes an aging process, which impairs the normal functioning over time. Another known technique for transferring signals between two electrically isolated electronic units is to utilize an impulse transformer comprising two mutually electrically isolated coils on a strongly magnetically conductive core or two coils which are coupled only by air. The disadvantages of utilizing an impulse transformer are that its transmission rate is limited, and that in certain circumstances it has a very large volume and is very heavy. Furthermore, an impulse transformer does not allow transmission of a d.c. voltage signal.

A typical example of a system with two electrically isolated electronic units is a switched-mode power supply wherein the primary side and the secondary side are electrically separated from one another, but an item of information concerning the output voltage at the secondary side must be transferred to the primary side. Other examples include circuit modules comprising a high-voltage switch and an operating and/or control circuit, said operating and/or control circuit being electrically separated from the high-voltage switch in order to prevent a high voltage at the operating and/or control circuit. In what are known as high-voltage cascades, as well, mutually communicating elements must be electrically separated from one another.

Another example of a system wherein a decoupling between a transmitting unit and a receiving unit is required is a half-bridge circuit with a series circuit containing a high-side switch, which is realized as a semiconductor switching element, and a low-side switch, realized as a semiconductor switching element. If the two semiconductor switching elements have the same conductivity type, i.e. they are both constructed as n-conductive transistors such as n-channel MOSFETs, n-channel IGBTs, or npn-bipolar transistors, the problem arises that the actuating of the high-side switch requires a drive signal which is related to a potential at the node shared by the two switches, whereby this potential fluctuates approximately between a reference potential of the circuit and a supply potential of the circuit, depending on the state of the low-side switch. Output signals of a signal processing circuit according to which the high-side switch and the low-side switch are to conduct are usually related to the reference potential of the circuit, typically ground, so that the output signals of the signal processing circuit cannot be utilized directly to actuate the high-side switch. A known technique for adapting the level of the these output signals to the required level for actuating the high-side switch is to transfer the low-side signals of the signal processing circuit by means of the above mentioned opto-coupler or impulse transformer.

Beyond this, in the half-bridge the drive signal can be transferred to the high-side switch by means of current coupling or capacitive coupling. In current coupling, the drive signal is transferred as a pulsed current signal, whereby the pulsed signal can be processed directly or converted into a voltage signal first. In capacitive coupling, the signal is transferred from the processing circuit via a decoupling capacitor, which is able to block the maximum voltage that occurs between the low-side processing circuit and the high-side switch.

According to a technique for distributing a clock signal on a chip while avoiding a line connection as described in *On-Chip Wireless Interconnection With Integrated Antennas* (Kihong Kim, Hyun Yoon, Kenneth K. O., IEEE Document 0-7803-6441-4/00), a transmitter for sending microwave signals and a plurality of receivers for receiving the microwave signals are provided on a chip.

SUMMARY OF THE INVENTION

It is accordingly an object of the invention to provide a method for transferring a signal from a first electronic unit to a second electronic unit in a system comprising at least two electronic units, which overcomes the above-mentioned disadvantages of the heretofore-known devices and methods of this general type and which makes possible an electrical separation between the first electronic unit and the second electronic unit and a high transfer rate, and which can be realized in such a way that space is saved.

With the foregoing and other objects in view there is provided, in accordance with the invention, a signal transfer method in a system having at least two electronic units. The method of transferring a signal from a first electronic unit having a signal source to a second electronic unit having a signal sink comprises:

converting a signal to be transferred into a line-independent electromagnetic wave with a transmitting unit; and receiving the line-independent electromagnetic wave with a receiving unit and converting the electromagnetic wave into a reception signal.

In other words, the inventive method provides that, in order to transfer a transmission signal from a first electronic unit comprising a signal source to a second electronic unit comprising a signal sink, the signal to be transferred is converted by a transmitting unit into an unguided electromagnetic wave, and that the unguided electromagnetic wave which is emitted by the transmitting unit is received by a receiving unit and converted into a reception signal for the signal sink in the second electronic unit. The transmitting unit and receiving unit are tuned to each other; i.e., the receiving unit is designed to receive and demodulate the electromagnetic waves that are emitted by the transmitting unit. Given approximately clear transmission, the reception signal which is acquired by demodulation from the high-frequency signal in the reception unit corresponds to the transmission signal.

Most importantly, utilizing line-independent, i.e., unguided electromagnetic waves for signal transfer makes it possible to electrically isolate the first electronic unit, wherein the transmission signal is generated and by which the signal is transferred, from the second electronic unit, to which the signal is transferred following modulation to the high-frequency signal. With today's technology, high-frequency circuits for the transmitting unit and the receiving unit can be realized economically and compactly as semiconductor elements composed of silicon or some other semiconductor material. Secondly, these high-frequency circuits, which expediently operate in the gigahertz region, make possible a high data transfer rate. Depending on the purpose of application, analog or digital signals can be modulated onto the electromagnetic wave, which lends the inventive method versatility.

For carrying out the inventive method, a transmitting unit is allocated to the first electronic unit comprising the signal source, and a receiving unit is allocated to the second electronic unit comprising the signal sink. The transmitting unit can be a component of the first electronic unit, and the receiving unit can be a component of the second electronic unit, it being possible to realize the high-frequency circuit for realizing the transmitting unit in the same chip as the appertaining signal source, and to realize the high-frequency circuit for realizing the receiving unit in the same chip as the signal sink. The signal source is advantageously connected to the transmitting unit via a line connection, and the signal sink is connected to the receiving unit via a line connection.

The transmitting unit is specifically a conventional integrated high-frequency circuit which is designed to modulate an analog or digital signal with which it is supplied onto a high-frequency carrier signal, and to deliver the modulated high-frequency signal. The modulation which is carried out in the transmitting unit is any modulation that is suitable for converting an analog or digital signal into a high-frequency signal.

Advantageously, in the transfer of a digital signal, this signal is coded onto the carrier wave in the transmitting unit prior to modulation in order to add redundancy to the signal to be transferred and to make the signal less susceptible to interference on the transmission channel. Block codes or convolution codes, for instance codes such as are described in *Digital Communications* (Proakis, $3^{rd}$ ed., McGraw Hill, 1995, Ch. 8), are suitable for coding digital signals prior to their modulation onto the high-frequency carrier signal.

The transmission power of the high-frequency circuit on the transmission side is tuned to the distance over which the signal must be transferred in the system. This distance is between several millimeters (when only a d.c. coupling is intended) and several meters.

The receiving unit is preferably a conventional integrated high-frequency circuit which is capable of receiving and demodulating a high-frequency unguided electromagnetic signal. The frequency band of the receiving unit is tuned to the frequency band of the appertaining transmitting unit. When in the transmission of a digital signal the transmission signal is coded on the transmission side prior to the modulation onto the high-frequency carrier signal, a decoding which is tuned to the coding on the transmission side is performed in the receiving unit following the demodulation of the high-frequency signal, in order to acquire the reception signal, that is to say, to recover the transmission signal.

Because line connections between the mutually communicating electronic units are not required in the inventive method, the electronic units with the appertaining transmission and reception units can be configured in the system almost in any spatial arrangement. If a signal transfer is to be realized given a state of electrical separation between the first electronic unit and the second electronic unit, then the transmitting unit and the receiving unit can also be realized in a common housing but on two different chips, with a line connection installed between the signal source and the common housing wherein the transmission unit and receiving unit are installed, and between the signal sink and the common housing, respectively.

The electronic units which communicate with one another in a system with the aid of unguided electromagnetic signals according to the inventive method are arbitrary electronic units which are designed for generating and/or processing signals. Examples include controllers, memory modules, or CPUs in a computer, or primary-side and secondary-side circuit components in a switched-mode power supply.

A plurality of signal sources are advantageously connected to a common transmitting unit, and a plurality of signal sinks are connected to a common receiving unit. According to an embodiment of the invention, the signals of the individual signal sources which are connected to the same transmitting unit are transferred in different frequency bands of the high-frequency signal that is delivered by the transmitting unit, as is known from carrier frequency technology, namely from methods for FDMA data transmission. Such FDMA methods are described in *Proakis* (infra, pp. 842–44), which is hereby incorporated by reference.

Another embodiment of the inventive method provides that, prior to the modulation onto the carrier signal, a digital signal sequence is formed from a plurality of digital signal sequences that are to be transmitted, which has a higher frequency than the individual signal sequences and which contains the information of the individual signals that are to be transferred. In this process, equally long data series of the individual signals are allocated to different time windows of the higher-frequency signal series in periodic fashion, as is known from time division multiple access (TDMA) techniques for data transmission. Such TDMA methods are described in *Proakis* (infra, pp. 842–44) among other sources.

According to another exemplary embodiment, the transfer of a plurality of signals in a system is accomplished by the utilization of a plurality of transmitting units which are connected to the respective signal sources. In order to prevent reciprocal interference by the high-frequency signals that are delivered by the transmitting units, it is provided that the individual high-frequency signals have different carrier frequencies, while the receiving units are designed to selectively receive only high-frequency signals from a specific frequency band which is tuned to the respective transmitting unit or units, so that they only receive signals of a select transmitting unit or of several select transmitting units and convert these into a reception signal for the connected signal sink or sinks.

In another embodiment of the method for transferring a plurality of signal sequences with the aid of a plurality of transmitting units, which is particularly suitable for transferring a plurality of digital data sequences in a system, it is provided that, prior to being modulated onto an unguided high-frequency signal, the individual data sequences are multiplied by various sequences, the frequencies of which are higher than the frequencies of said data sequences. The data sequences are "spread" by the multiplication by the higher-frequency sequences. The spread signals resulting from the multiplication of the data sequences by the respective other sequences are then modulated onto a high-frequency carrier signal in the transmitting unit, whereby the carrier frequency of this carrier signal can be the same in all transmitting units. Following the demodulation of the high-frequency carrier signals, the data sequences can be recovered in the receiving units with the aid of the sequences used in the spreading operation by multiplying the spread signal bit by bit with the sequence that was used in the spreading. The sequences with which the individual signals that are to be transmitted are spread differ and are so tuned to one another that spread signals that were multiplied prior to transfer by a sequence other than the sequence being used for signal recovery lay superimposed on the received useful signal as noise. The utilization of such spread signals for data transfer is known from methods for digital data transmission by Code Division Multiple Access (CDMA). The CDMA method is described in *Proakis* (infra, pp. 852–62).

In the conversion of the data sequences that are to be transferred into high-frequency radio signals, any known coding and modulation methods can be utilized to transfer the data sequence in an optimally efficient manner with respect to bandwidth and/or to make the signal that will be transferred optimally resistant to noise influences.

Because electromagnetic waves are utilized for transferring signals between electronic units in a system, line connections between these electronic units can be largely avoided. Thus, simpler printed circuit boards can be used for assembling the individual modules; in particular, multi-layered motherboards can be avoided. Beyond this, the signals can also be transferred over long distances in the system, while substantial freedom in arranging the electronic units and the appertaining transmitting and receiving units is maintained. The transmission power with which the high-frequency signal is delivered is tuned to the distance over which the signal is to be transmitted. Furthermore, the individual electronic units can be "more densely packed" on the PCB, because space is not needed for line connections between the individual electronic units.

In an inventive system for achieving the above object, at least one first and one second electronic unit are provided, whereby the first electronic unit includes a signal source for producing a transmission signal and a transmitting unit for converting the transmission signal into an unguided electromagnetic wave. The second electronic unit includes a receiving unit and a signal sink, whereby the receiving unit is designed for receiving the unguided electromagnetic wave and converting the unguided electromagnetic wave into a reception signal.

The transmitting and receiving units are advantageously integrated in a semiconductor chip, whereby the transmitting unit can be integrated in the same semiconductor chip as the signal source, and the receiving unit can be integrated in the same semiconductor chip as the signal sink.

To avoid noise radiation, the overall system is advantageously enclosed in an electromagnetically shielding housing.

The system advantageously includes a plurality of transmitting units and a plurality of receiving units, whereby a plurality of signal sources can be allocated to one receiving unit, and a plurality of signal sinks can be allocated to one receiving unit.

In an embodiment of the invention, it is provided that the transmitting units are tuned to one another in such a way that they convert the signals that are supplied to them for transmission purposes into high-frequency signals with different carrier frequencies, so that the individual high-frequency signals do not interfere with one another. The receiving units are tuned to one or more transmitting units in order to receive high-frequency signals only from this/these transmitting unit/units.

Other features which are considered as characteristic for the invention are set forth in the appended claims.

although the invention is illustrated and described herein as embodied in a method and device for transferring a signal from a signal source to a signal sink in a system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Unless otherwise indicated, identical reference characters in pertain to identical and functionally equivalent parts throughout the figures.

DESCRIPTION OF THE PREFERRED EMBODIMENTS

Figure 1:
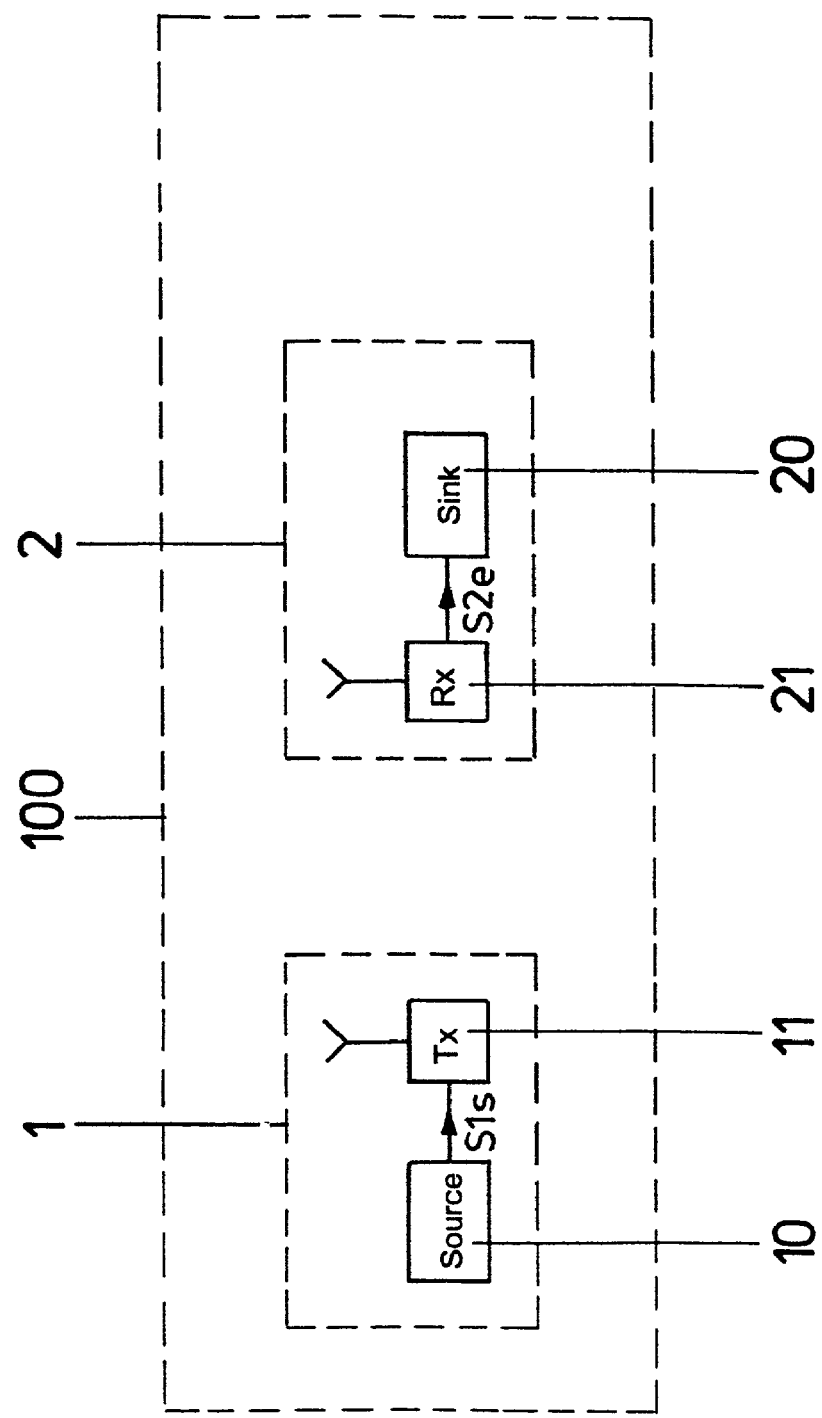
FIG. 1 is a block diagram of a system with a first electronic unit for transmitting a signal and a second electronic unit for receiving a signal.

Referring now to the figures of the drawing in detail and first, particularly, to FIG. 1 thereof, there is shown a first exemplary embodiment of a system 100 for carrying out the inventive method of signal transmission. The system 100 includes a first electronic unit 1 with a signal source 10 and a transmitting unit 11 and a second electronic unit 2 with a receiving unit 21 and a signal sink 20. The system 100 is expediently surrounded by an electromagnetically shielding housing.

The signal source 10 provides a transmission signal S1s, which is modulated onto a line-independent high-frequency electromagnetic signal in the transmitting unit 11 and released from same. The transmitting unit 11 is advantageously a conventional high-frequency transmitter which is designed to convert an analog or digital transmission signal S1s into a high-frequency radio signal and to emit the high-frequency signal. The transmission power with which the transmitting unit sends out the signal is adjusted to the distance over which the signal is transmitted to the receiving unit.

The high-frequency signal which is emitted by the transmitting unit 11 is received by the receiving unit 21 of the second electronic unit 2, demodulated, and converted into a reception signal S2e, which is fed to the signal sink 20. Given clear transmission, the reception signal S2e corresponds to the transmission signal S1s. The receiving unit 21 is advantageously a conventional high-frequency receiver whose reception frequency is tuned to the transmission frequency of the transmission unit.

In the inventive method, a line connection between the signal source 10 and the signal sink 20 can be avoided. The transmitting unit 11 and the receiving unit 21 can be produced cost-effectively as integrated circuits, for instance in silicon technology, so that compared to a line connection the additional wiring outlay remains limited.

On one hand, the inventive method, namely the transmission of a transmission signal S1s with the aid of a high-frequency radio signal, makes possible a signal transfer given the electrical isolation of the two communicating electronic units 1 and 2. On the other hand, substantially higher data rates are possible with a signal transfer with the aid of high-frequency signals in the gigahertz range compared to systems wherein a data bus serves for data transfer.

The two electronic units 1, 2 can be separately arranged in the system 100, whereby, in the exemplary embodiment represented in FIG. 1, the transmitting unit 11 is a component of the first electronic unit 1, and the receiving unit 21 is a component of the second electronic unit 2. According to another exemplary embodiment of the invention, the transmitting unit 11 can be disposed in the same semiconductor chip as the signal source 10, and the receiving unit 21 can be disposed in the same semiconductor chip as the signal sink 20, but at the very least the transmitting unit 11 and the signal source 10 can be packaged in one housing, and the receiving unit 21 and the signal sink 20 are packaged in an additional housing.

The transfer of the transmission signal S1s by means of a radio signal to the receiving unit 21 can also serve merely for the electrical isolation of the two electronic units 1, 2. The transmitting unit 11 and the receiving unit 21 can be packaged in a common housing, whereby a line connection can exist between the signal source 10 to the transmitting unit 11 in the common housing, and also from the signal sink 20 to the receiving unit 21 in their common housing. The transmitting unit 11 and the receiving unit 21 are separated from one another in this common housing, an insulating material which is permeable to electromagnetic waves being arranged between the transmitting unit 11 and the receiving unit 21.

The frequencies of the transmitting unit 11 and the receiving unit 21 are so tuned to one another that the receiving unit is able to receive the electromagnetic signal that is emitted by the transmitting unit and convert it into the reception signal S2e.

The inventive method serves for transferring data between modules on a motherboard of a computer or between arbitrary circuit components on a motherboard. Additional examples of application include the transfer of analog signals from a secondary side to a primary side in a switched-mode power supply, between a control circuit and a unit with a switch and a drive circuit in a switching module, or between any units that must be electrically decoupled and between which a signal exchange must occur. The electronic units are accordingly controllers, memories, CPUs, regulators, control circuits, or the like.

Another example of applying the inventive method is the driving of two transistors which are connected to a half-bridge, one of which serves as a high-side switch and the other of which serves as a low-side switch. The control circuits of the high-side switch and the low-side switch are expediently electrically separated from one another. The inventive method serves to make possible a signal exchange between the control circuit for the high-side switch and the control circuit for the low-side switch.

In the inventive method, a digital signal that is to be transferred is coded by means of a block code or a convolution code in the transmitting unit 11 prior to being modulated onto the high-frequency carrier signal, in order to increase the signal-noise interval for the transfer over the radio channel. The transmitting unit 11 advantageously utilizes an arbitrary known coding and modulation method for converting the transmission signal S1s into the high-frequency signal.

Figure 2:
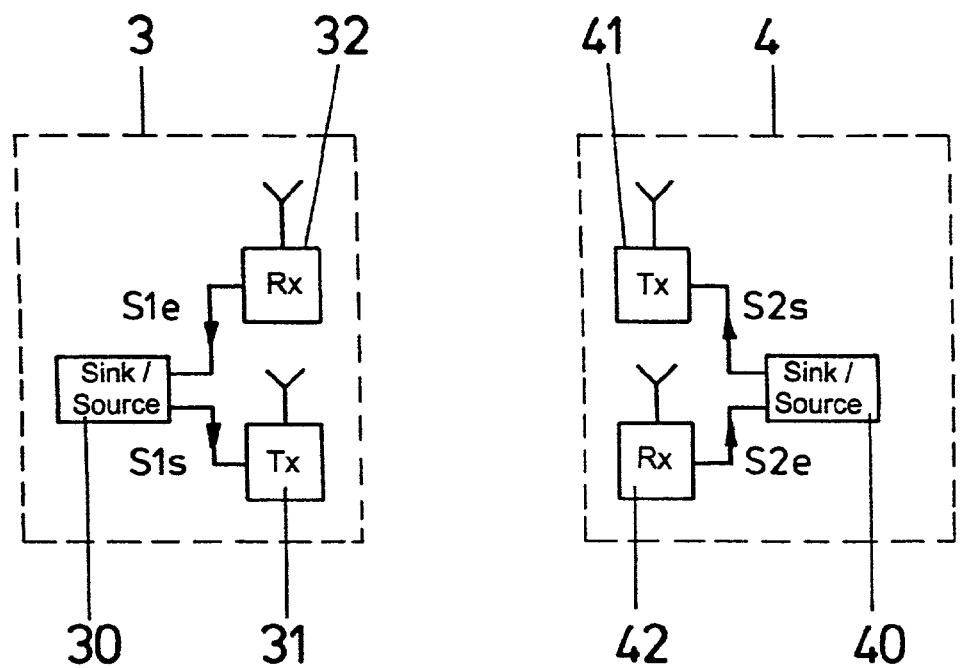
FIG. 2 is a diagram of a system with a first electronic unit for transmitting and receiving a signal and a second electronic unit for transmitting and receiving a signal.

FIG. 2 shows an additional exemplary embodiment of a system wherein a first electronic unit 2 includes a signal source and signal sink 30, to which a transmitting unit 31 and a receiving unit 32 are connected. A second electronic unit 4 includes a signal source and sink 40 to which a transmitting unit 41 and a receiving unit 42 are connected. The signal source and sink 30 provides a first transmission signal S1s, which is fed to the transmitting unit 31. The transmitting unit 31 converts this transmission signal S1s into an unguided electromagnetic high-frequency signal and emits this. In the second electronic unit 4, a receiving unit 42 is provided, which receives the electromagnetic signal emitted by the transmitting unit 31 and converts it into a reception signal S2e, which is fed to the signal source and sink 40. In a corresponding manner, the transmitting unit 41 of the electronic unit 4 converts a transmission signal S2s of the signal source and sink 40 into a high-frequency electromagnetic radio signal, which is received by the receiving unit 32 of the first electronic unit 3 and converted into a reception signal S1e, this being fed to the signal source and sink 30.

In the exemplary embodiment according to FIG. 2, a data exchange, i.e. the transfer of a signal from the first electronic unit 3 to the second electronic unit 4 and vice versa, is possible. In this system also, signals can be transferred over greater distances between the electronic units 3, 4. But a signal transfer wherein merely d.c. decoupling between the first electronic unit 3 and the second electronic unit 4 is required can also be performed. The transmitting units and receiving units 31, 32, 41, 42 can then be packaged in a common housing, as described above, with line connections present between the signal sources and sinks 30, 40 to the transmitting and receiving units 31, 32, 41, 42 in the common housing.

In an exemplary embodiment of the inventive method, the carrier frequencies of the output signals of the transmitting unit 31 and the transmitting unit 41 differ, so that the high-frequency signals which are emitted by the two transmitting units 31, 41 do not interfere with each other. The receiving unit 42 is tuned to the transmission frequency of the transmitting unit 31, and the receiving unit 32 is tuned to the transmission frequency of the transmitting unit 41.

In another exemplary embodiment of the inventive method, the transmission signals S1s, S2s are transferred by a CDMA technique whereby the high-frequency signals can have the same carrier frequency, and whereby the signals S1s, S2s that are to be transmitted are "spread" with the aid of different series of sequences prior to the conversion into high-frequency signals. The sequences utilized for spreading the transmission signals S1s, S2s are applied in the receiving units 32, 42 for generating the reception signals S1e, S2e.

Figure 3:
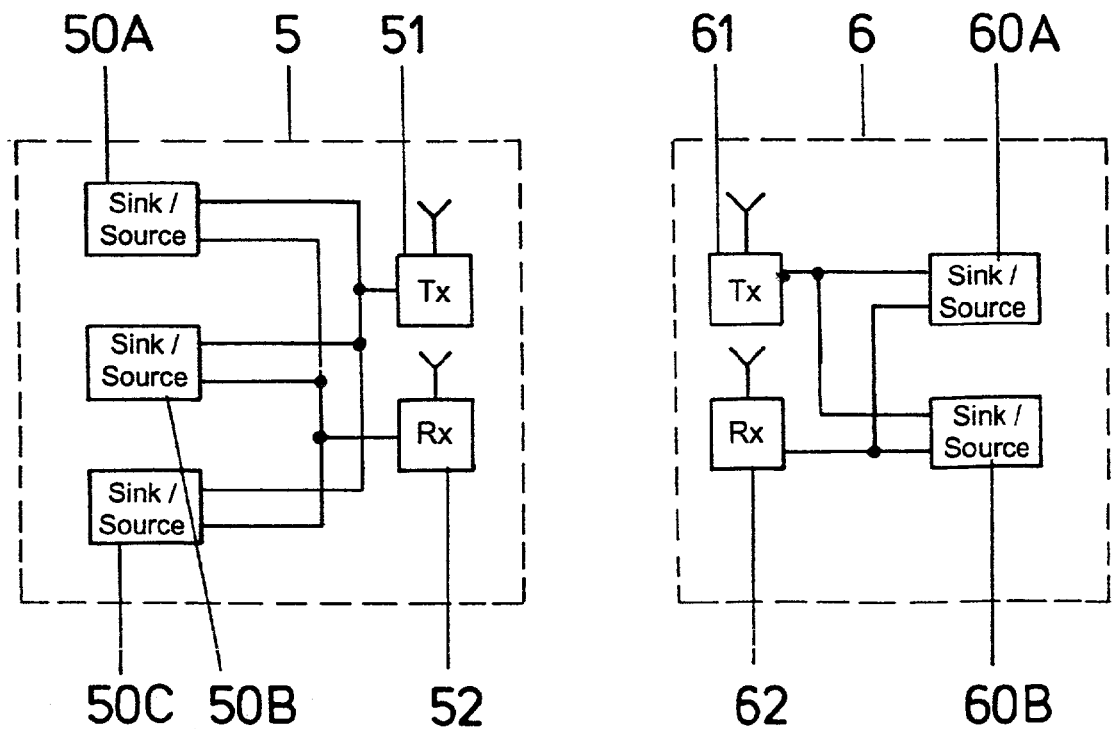
FIG. 3 is a diagram of a system with a first electronic unit comprising a plurality of signal sources/signal sinks and a second electronic unit comprising a plurality of signal sources/signal sinks.

FIG. 3 shows a system with a first electronic unit 5 comprising three signal sources and sinks 50A, 50B, 50C, which are respectively connected to a transmitting unit 51 and a receiving unit 52. A second electronic unit 6 of the system according to FIG. 3 comprises two signal sources and sinks 60A, 60B, which are connected to a transmitting unit 61 and a receiving unit 62, respectively. The transmitting units 51, 61 are designed to convert transmission signals from the signal sources 50A, 50B, 50C and the signal sources 60A, 60B into a respective high-frequency signal, whereby this high-frequency signal communicates the information of the signals from the individual signal sources 50A, 50B, 50C and 60A, 60B, 60C, respectively. The conversion by the signal sources and sinks of the signals to be transferred into the high-frequency signals that are emitted by the transmitting units 51, 61, the transfer of said high-frequency signals, and the subsequent recovery of the transmission signals are accomplished by FDMA or TDMA techniques, whereby the circuit components which are required for this are implemented in the transmitting and receiving units 51, 61, 52, 62.

The individual signal sources 50A, 50B, 50C and 60A, 60B can be disposed far from one another and from the respective transmitting and receiving units 51, 61, 52, 62, with line connections disposed between the signal sources and sinks 50A, 50B, 50C and 60A, 60B and the transmitting and receiving units 51, 61, 52, 62.

Figure 4:
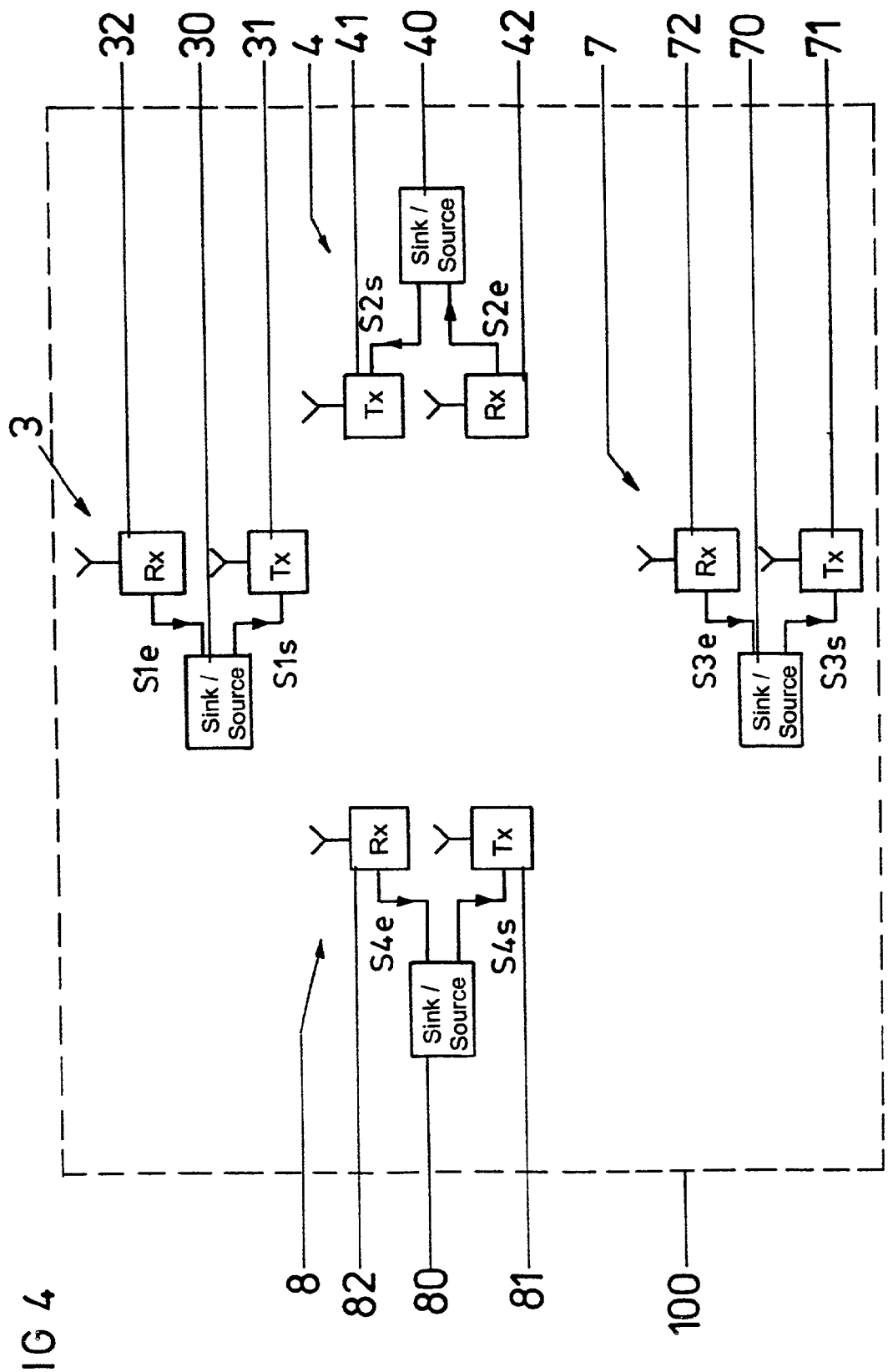
FIG. 4 is a distributed block diagram of a system with a plurality of signal sources/signal sinks, to which a transmitting unit and a receiving unit are respectively allocated.

FIG. 4 represents a system 100 with four electronic units 3, 4, 7, 8, whereby each electronic unit comprises a signal source and sink 30, 40, 70, 80, these being respectively connected to a transmitting unit 31, 41, 71, 81 and a receiving unit 32, 42, 72, 82.

An embodiment of the inventive method provides that, in the system according to FIG. 4 and the systems according to FIGS. 2 and 3, wherein more than one high-frequency radio signal is utilized for the signal transfer, the carrier frequencies of the individual high-frequency signals differ.

Another embodiment of the invention according to FIG. 4 provides that the signals that are to be transmitted are transferred by a CDMA technique. In a system with a plurality of signal sources, some signals can be transferred by CDMA, and other signals can be transferred by means of high-frequency signals having different carrier frequencies.

Figure 5:
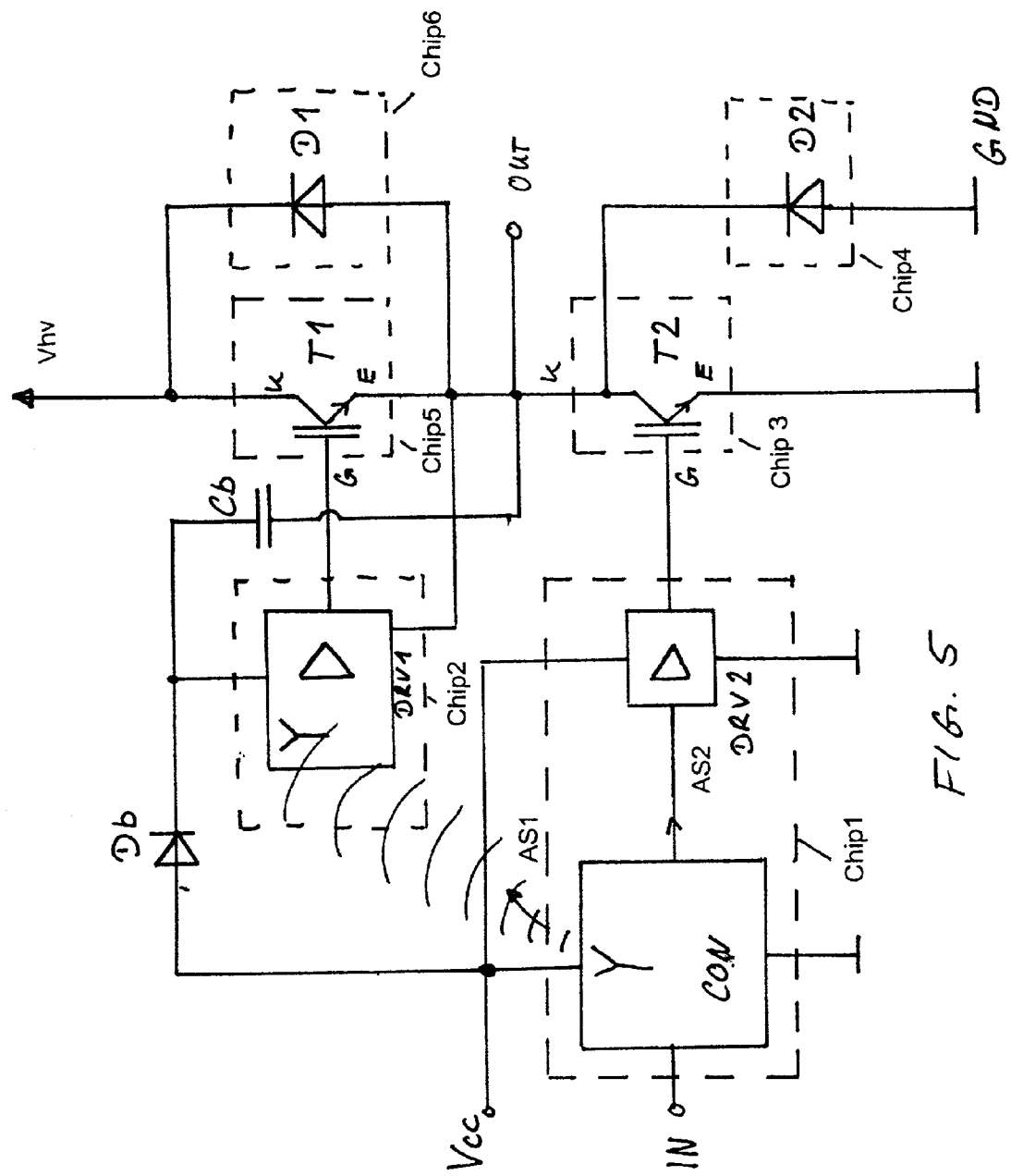
FIG. 5 is a schematic block diagram of a system wherein a signal source is a signal processing unit for providing a drive signal for a high-side switch and a low-side switch of a half-bridge, and wherein the signal sink is a drive circuit for the high-side switch.

FIG. 5 represents an exemplary embodiment of an inventive system wherein a signal source is part of a signal processing circuit CON for providing a drive signal for a high-side switch T1 and a low-side switch T2 of a half-bridge.

The high-side switch and the low-side switch are realized as n-conductive IGBTs whose collector-emitter systems are connected in series between a supply potential Vhv and a reference potential GND, typically ground. A first diode D1 and a second diode D2 are respectively connected in parallel with the collector-emitter systems of the IGBTs T1, T2 as freewheeling diodes. The switches T1, T2 can also be realized as n-conductive MOSFETs or npn bipolar transistors, wherein case separate freewheeling diodes can be forgone.

The half-bridge circuit serves for driving a load which is connectible to an output terminal OUT shared by the two IGBTs T1, T2 but which is not included in the figure.

The low-side switch T2 is switched to conduct by the application of a drive signal at its gate terminal G which is higher than the potential at its collector terminal K, which equals reference potential GND. This drive signal AS2 is generated by the processing circuit CON in dependence upon an input signal IN and amplified by a drive circuit DRV2, which is connected to the processing circuit CON on load side and to the gate terminal G of the low-side switch T2 on line side. The signals which are generated—that is to say, processed—by the processing circuit are related to reference potential GND, so that the drive signal for the low-side switch T2 can be fed to it directly—that is to say, fed in amplified form by way of a simple drive circuit DRV.

To activate the high-side switch T1, a drive signal that is higher than the potential at its collector terminal K must be applied at its gate G. This collector potential is dependent upon the state of the low-side switch T2 and can fluctuate approximately between reference potential GND and supply potential Vhv. Thus, drive signals that are generated by the processing circuit are not suitable for directly activating the high-side switch T1, but rather their level must be adapted to the requirements of the high-side switch T1.

It is therefore inventively provided that the processing circuit CON include a transmitting unit, which emits a radio signal that is dependent on a drive signal AS1 for the high-side switch, whereby a drive circuit DRV1 which is connected to the gate terminal G of the high-side switch T1 includes a receiving unit for receiving the radio signal. This radio signal is converted in the drive circuit DRV1 into a suitable drive signal for activating the high-side switch T1 via its gate terminal G. In this example the drive circuit DRV1 is connected between the emitter terminal E of the high-side switch T1 and a bootstrap circuit, in order to provide drive signals which are related to the emitter potential of the high-side switch. The bootstrap circuit—which includes a diode that is connected between the logic supply potential Vcc and a supply terminal of the drive circuit DRV1, and a capacitor Cb that is connected between the emitter of the high-side switch T1 and the supply terminal—ensures that the potential at the supply terminal is always higher than the emitter potential by the value of the voltage at the capacitor Cb, in order to provide, in accordance with the received radio signal, drive signals which are above the emitter potential of the high-side switch T1 for purposes of switching it to conduct.

Compared to prior art methods which utilize optical couplers, impulse transformers, capacitive couplers or current couplers, the transfer of a drive signal AS1 from the processing circuit CON to the drive circuit DRV1 across a radio interface for purposes of d.c. decoupling offers several advantages.

Specifically, compared to a current coupling method or a capacitive coupling method, integrated high-volt components are spared, because both the processing circuit CON (i.e. the transmitting unit) and the drive circuit DRV1 (i.e. the receiving circuit) can be realized as low-volt components. The maximum voltage occurring between the supply terminals of the drive circuit DRV1 by way of the bootstrap circuit corresponds to the logic supply voltage VCC.

Compared to utilizing an impulse transformer, the inventive method saves steps by which a high-volt transformer would have to be realized in the processing circuit or drive circuit. Lastly, compared to utilizing an optical coupler, special semiconductor materials, which would be needed for fabricating the optical coupler, can be forgone. Furthermore, processing speed is gained, because optical couplers typically exhibit a low signal transmission rate.

Besides this, the inventive method saves terminal pins compared to all the known methods, because the information is transferred across the radio interface.

As emerges from FIG. 5, the transmitting unit which generates the high-frequency signal, including a transmitting antenna, is integrated in a first chip, which, besides the processing unit CON, also contains the drive circuit DRV2 for the low-side switch T2. The receiving unit which receives the high-frequency signal, including a receiving antenna, is integrated in a second chip, which also includes the drive circuit DRV2 for the high-side switch.

The high-side IGBT T1, the low-side IGBT T2, and the two freewheel diodes are integrated in separate chips, respectively.

Any of the above described coding and modulation methods can be used for the coding and modulation of the signals that are generated in the processing unit and transferred.

We claim:

1. A method of transferring signals in a switching module having a processing unit and a switch unit with a switch and a drive circuit for controlling the switch, the method which comprises:

converting a signal to be transmitted from the processing unit to the switch unit into a line-independent electromagnetic wave; and receiving the line-independent electromagnetic wave with a receiving unit in the switch unit, converting the electromagnetic wave into a reception signal, and supplying the reception signal to the drive circuit for controlling the switch being a high-side switch of a half-bridge having the high-side switch and a low-side switch.

2. The method according to claim 1, which comprises emitting the line-independent electromagnetic wave with a transmitting unit.

3. The method according to claim 2, which comprises transmitting line-independent electromagnetic waves with different carrier frequencies.

4. The method according to claim 2, which comprises transmitting the line-independent electromagnetic wave via a transmission technique selected from the group consisting of FDMA and TDMA.

5. The method according to claim 2, which comprises transmitting the line-independent electromagnetic wave via a CDMA technique.

6. A system, comprising:

at least one first electronic unit having a signal source for providing a transmission signal and a transmitting unit connected to said signal source for converting the transmission signal into a line-independent electromagnetic wave;

at least one second electronic unit having a receiving unit for receiving the line-independent electromagnetic wave and converting the electromagnetic wave into a reception signal, and a signal sink connected to said receiving unit; and a half-bridge including a high-side switch and a low-side switch, and said first electronic unit is a signal processing unit, and said second electronic unit is a drive circuit connected to said high-side switch of said half-bridge.

7. The system according to claim 6, further comprising an electromagnetically shielding housing encasing said first and second electronic units.

8. The system according to claim 6, wherein at least one of the following is true: said signal source is one of a plurality of signal sources connected to said transmitting unit, and said signal sink is one of a plurality of signal sinks connected to said receiving unit.

9. The system according to claim 6, wherein said transmitting unit includes a transmitter for emitting electromagnetic waves in a gigahertz range, and said receiving unit includes a receiver for receiving electromagnetic waves in the gigahertz range.

* * * * *